(12) United States Patent
Cardone et al.

(10) Patent No.: US 7,067,855 B2
(45) Date of Patent: Jun. 27, 2006

(54) SEMICONDUCTOR STRUCTURE HAVING AN ABRUPT DOPING PROFILE

(75) Inventors: Frank Cardone, Yonkers, NY (US); Jack Oon Chu, Astoria, NY (US); Khalid EzzEldin Ismail, White Plains, NY (US)

(73) Assignee: International Business Machines Corporation, Armonk, NY (US)

( * ) Notice: Subject to any disclaimer, the term of this patent is extended or adjusted under 35 U.S.C. 154(b) by 138 days.

(21) Appl. No.: 10/735,167

(22) Filed: Dec. 12, 2003

(65) Prior Publication Data

US 2004/0185640 A1    Sep. 23, 2004

Related U.S. Application Data

(62) Division of application No. 08/885,611, filed on Jun. 30, 1997, now Pat. No. 6,723,621.

(51) Int. Cl.
| | |
|---|---|
| H01L 31/0328 | (2006.01) |
| H01L 31/0336 | (2006.01) |
| H01L 31/109 | (2006.01) |
| H01L 31/072 | (2006.01) |

(52) U.S. Cl. ............... 257/190; 257/19; 257/192; 257/616

(58) Field of Classification Search ........... 257/19, 257/192, 336, 344, 616, 190, 191, E21.125
See application file for complete search history.

(56) References Cited

U.S. PATENT DOCUMENTS

| 5,047,365 A | 9/1991 | Kawanaka et al. |
| 5,089,428 A | 2/1992 | Verret et al. |
| 5,181,964 A | 1/1993 | Meyerson |
| 5,227,644 A | 7/1993 | Ueno |
| 5,241,197 A | 8/1993 | Murakami et al. |
| 5,298,452 A | 3/1994 | Meyerson |
| 5,316,958 A | 5/1994 | Meyerson |

(Continued)

FOREIGN PATENT DOCUMENTS

EP      494395      7/1992

(Continued)

OTHER PUBLICATIONS

Sheldon P. et al. (1986) "Growth, Nucleation, and Electrical properties of Molecular Beam Epitaxially grown, As-doped Ge on Si Substrates" J. Vac. Sci. & Tech. A, vol. 4, No. 3, pt. 1, pp. 889-893.

(Continued)

*Primary Examiner*—Zandra V. Smith
*Assistant Examiner*—Khanh Duong
(74) *Attorney, Agent, or Firm*—Scully, Scott, Murphy, Presser, P.C.; Robert M. Trepp, Esq.

(57) ABSTRACT

A structure and method of forming an abrupt doping profile is described incorporating a substrate, a first epitaxial layer of Ge less than the critical thickness having a P or As concentration greater than $5 \times 10^{19}$ atoms/cc, and a second epitaxial layer having a change in concentration in its first 40 Å from the first layer of greater than $1 \times 10^{19}$ P atoms/cc. Alternatively, a layer of SiGe having a Ge content greater than 0.5 may be selectively amorphized and recrystalized with respect to other layers in a layered structure. The invention overcomes the problem of forming abrupt phosphorus profiles in Si and SiGe layers or films in semiconductor structures such as CMOS, MODFET'S, and HBT's.

9 Claims, 9 Drawing Sheets

U.S. PATENT DOCUMENTS

| | | | |
|---|---|---|---|
| 5,440,152 A | * | 8/1995 | Yamazaki .................. 257/197 |
| 5,607,511 A | | 3/1997 | Meyerson |
| 5,616,515 A | | 4/1997 | Okuno |
| 5,628,834 A | | 5/1997 | Copel et al. |
| 5,659,187 A | * | 8/1997 | Legoues et al. ............ 257/190 |
| 5,949,105 A | * | 9/1999 | Moslehi ...................... 257/336 |

FOREIGN PATENT DOCUMENTS

| | | |
|---|---|---|
| JP | 63-168021 | 7/1988 |
| JP | 6061489 | 3/1994 |
| JP | 2-288328 | 11/1998 |

OTHER PUBLICATIONS

Ismail K, et al (1992) "High Transconductance n-type Si/SiGe Modulation-Doped Field-Effect Transistors" IEEE Electron Device Letters, vol. 13, No. 5, pp. 229-231; and.

Ismail K, et al. (1991) High Electron Mobility in Modulation-Doped Si/SiGe Applied Physics Letters, vol. 58, No. 19, pp. 2117-2119.

* cited by examiner though the primary band gap reduction mechanism is the presence of the n-type dopants at relatively high levels instead of the effect of the Ge. In '958, FIG. 2 shows phosphorus being incorporated into a Si layer during UHV-CVD with and without the addition of 7% Ge containing gas. With 7% Ge containing gas, a decade increase in P concentration would be incorporated in 250 to 500 Å into a silicon layer as shown, for example, by the rate of incorporation from $7\times10^{18}$ atoms/cc to $5\times10^{19}$ atoms/cc in FIG. 2 of '958.

SEMICONDUCTOR STRUCTURE HAVING AN ABRUPT DOPING PROFILE

CROSS-REFERENCE TO RELATED APPLICATION

This is a divisional of U.S. patent application Ser. No. 08/885,611 filed Jun. 30, 1997 and now U.S. Pat. No. 6,723,621.

FIELD OF THE INVENTION

This invention relates to semiconductor films with steep doping profiles and more particularly to forming abrupt "delta-like" doping in thin layers from 5–20 nm thick suitable for Si or SiGe CMOS, modulation-doped field-effect transistors (MODFET's) devices, and heterojunction bipolar transistors (HBT's) using in-situ doping in a ultra high vacuum-chemical vapor deposition (UHV-CVD) reactor.

BACKGROUND OF THE INVENTION

In-situ phosphorus doping in epitaxial Si and SiGe films or layers using $PH_3$ has been known to demonstrate a very slow incorporation rate of P due to the "poisoning effect" of phosphine on the Si(100) surface. An example of such a doping behavior is shown in FIG. 1 by curve 11. Curve portion 13–14 of curve 11 shows the slow "transient" trailing edge observed in the SIMS profile and corresponds to the slow incorporation rate of P into the silicon film. In FIG. 1 the ordinate represents P concentration in atoms/cc and the abscissa represents depth in angstroms.

The incorporation of P into a Si layer is increased by the addition of a Ge containing gas (7%) along with phosphine in the reaction zone of a UHV-CVD reactor and has been described in U.S. Pat. No. 5,316,958 which issued May 31, 1994 to B. S. Meyerson and assigned to the assignee herein. The phosphorus dopant was incorporated during UHV-CVD in the proper substitutional sites in the silicon lattice as fully electrically active dopants. The amounts of Ge used were small enough that the primary band gap reduction mechanism is the presence of the n-type dopants at relatively high levels instead of the effect of the Ge. In '958, FIG. 2 shows phosphorus being incorporated into a Si layer during UHV-CVD with and without the addition of 7% Ge containing gas. With 7% Ge containing gas, a decade increase in P concentration would be incorporated in 250 to 500 Å into a silicon layer as shown, for example, by the rate of incorporation from $7\times10^{18}$ atoms/cc to $5\times10^{19}$ atoms/cc in FIG. 2 of '958.

Another well known problem associated with in-situ phosphorus or boron doping in silicon CVD is its "memory effect" as shown by curve portion 15–16 in FIG. 1 for the case of phosphorus herein which tends to create an undesirable high level of dopant in the background due to its "autodoping behavior". This "memory effect" is also evident in the SIMS analysis shown in FIG. 1. The "memory effect" corresponds to a very slow fall or decrease in the phosphorus concentration which stems from a residual background autodoping effect. Hence, in-situ doping typically generates a very undesirable "smearing out" of the dopant profile in silicon films formed by CVD.

FIG. 2 shows curve 11 which is the same as shown FIG. 1 and which illustrates the doping profile of the prior art using $PH_3$. Curve 20 shows a desired or targeted profile having a width of 100 angstroms. In FIG. 2, the ordinate represents P concentration in atoms/cc and the abscissa represents depth in angstroms. Curve 11 has a dopant profile of at least 5 times wider or thicker than the targeted profile of 100 Angstroms in width or in depth as shown by curve 20.

As device dimensions shrink and especially for future complementary metal oxide semiconductor (CMOS) logic, MODFET's, and HBT's incorporating SiGe layers, very thin layer structures having a width or thickness of 5–20 nm of high doping P concentrations will be needed which are impossible to obtain with present technology at this point using present ultra high vacuum-chemical vapor deposition (UHV-CVD) or standard silicon CVD processing.

SUMMARY OF THE INVENTION

In accordance with the present invention, a structure is provided having an increasing or decreasing abrupt doping profile comprising a substrate such as Si or SiGe having an upper surface, a first epitaxial layer of substantially Ge formed over the upper surface, the first layer having a thickness in the range from 0.5 to 2 nm and doped e.g. with phosphorus or arsenic to a level of about $5\times10^{19}$ atoms/cc, and a second epitaxial layer of a semiconductor material having any desired concentration of dopants. The second layer may be Si or $Si_{1-x}Ge_x$. The concentration profile from the edge or upper surface of the first layer to 40 Å into the second layer may change by greater than $1\times10^{19}$ dopant atoms/cc.

The invention further provides a method comprising the steps of selecting a substrate having an upper surface, growing a first epitaxial layer of substantially Ge thereover less than its critical thickness and doped with phosphorus to a level of about $5\times10^{19}$ atoms/cc, growing a second epitaxial layer selected from the group consisting of Si and SiGe, the second epitaxial layer having any desired doping profile. The presence of the epitaxial Ge layer accelerates the incorporation rate of the P or As doping into the Ge layer, thereby eliminating the slow transient behavior. The initial, in-situ doping level is determined by the dopant flow in SCCM of the $PH_3$/He mixture. The final overall doping profile may be controlled as a function of 1/GR where GR is the growth rate of the first and second layer. The dopant may be supplied or carried by phosphine ($PH_3$) or Tertiary Butyl Phosphine (TBP) gas in the case of P and $AsH_3$ or Tertiary Butyl Arsine (TBA) in the case of As in a UHV-CVD reactor.

To eliminate background "autodoping effect", the structure with phosphorus doping as shown in FIG. 3 is transferred to a load chamber or load lock, while the growth chamber is purged of the background phosphorus. This growth/interrupt/growth process involves hydrogen flushing of the UHV-CVD reactor during interrupt. Then, a coating of Si or SiGe is grown on the sidewalls and/or heated surfaces of the UHV-CVD reactor at high temperature to isolate, eliminate or cover the residual phosphorus atoms prior to reintroducing the structure for further deposition. Alternatively, a second growth chamber i.e. UHV-CVD reactor coupled to the load chamber may be used where further undoped layers may be deposited with very low levels of phosphorus.

A second epitaxial layer 40 and/or a third epitaxial layer 44 of Si or SiGe shown in FIG. 3 may now be grown with a background doping profile that drops or decreases to less than $5\times10^{16}$ atoms/cc after a 300 Å film is grown over layer 36 of structure 30 shown in FIG. 3.

The invention further provides a method for forming abrupt doping comprising the steps of forming a layered structure of semiconductor material, selectively amorphizing a first layer having a high Ge content greater than 0.5, and crystallizing the amorphized first layer by solid phase regrowth. The amorphized first layer may be formed by ion implantation.

The invention further provides a field effect transistor comprising a single crystal substrate having source and drain regions with a channel therebetween and a gate electrode above the channel to control charge in said channel and a first layer of Ge less than the critical thickness doped with a dopant of phosphorus or arsenic positioned below the channel and extending through the source and drain regions.

The invention further provides a field effect transistor comprising a single crystal substrate, a first layer of Ge less than the critical thickness formed on the substrate and doped with a dopant of phosphorus or arsenic, a second layer of undoped SiGe epitaxially formed on the first layer, a third layer of strained undoped simiconductor material of Si or SiGe, a source region and a drain region with a channel therebetween and a gate electrode above the channel to control charge in the channel.

The invention further provides a field effect transistor comprising a single crystal substrate, an oxide layer formed on the substrate having an opening, a gate dielectric and a gate electrode formed in the opening over the substrate, a source and drain region formed in the substrate aligned with respect to the gate electrode, a dielectric sidewall spacer formed on either side of the gate electrode and above a portion of the source and drain regions, a first layer of Ge less than the critical thickness doped with a dopant of phosphorus or arsenic selectivel position over exposed portions of the source and drain regions, a second layer of semiconductor material selected from the group consisting of Si and SiGe doped with a dopant of phosphorus or arsenic epitaxially formed over the first layer to form raised source and drain regions.

BRIEF DESCRIPTION OF THE DRAWING

These and other features, objects, and advantages of the present invention will become apparent upon consideration of the following detailed description of the invention when read in conjunction with the drawing in which.

DESCRIPTION OF THE PREFERRED EMBODIMENTS

Figure 1:
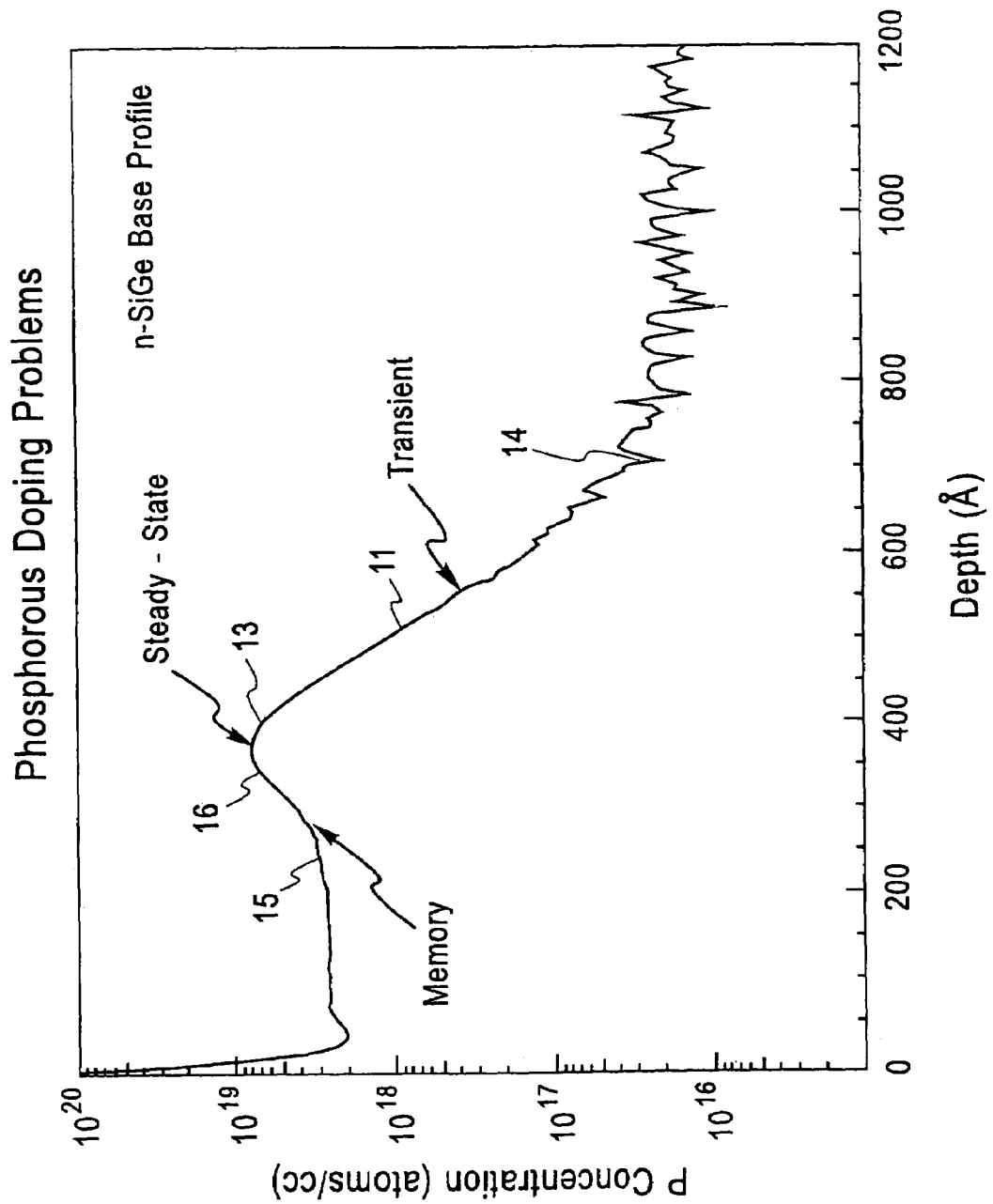
FIG. 1 is a graph of P concentration versus depth in a SiGe substrate showing an actual concentration profile of the prior art.
Figure 2:
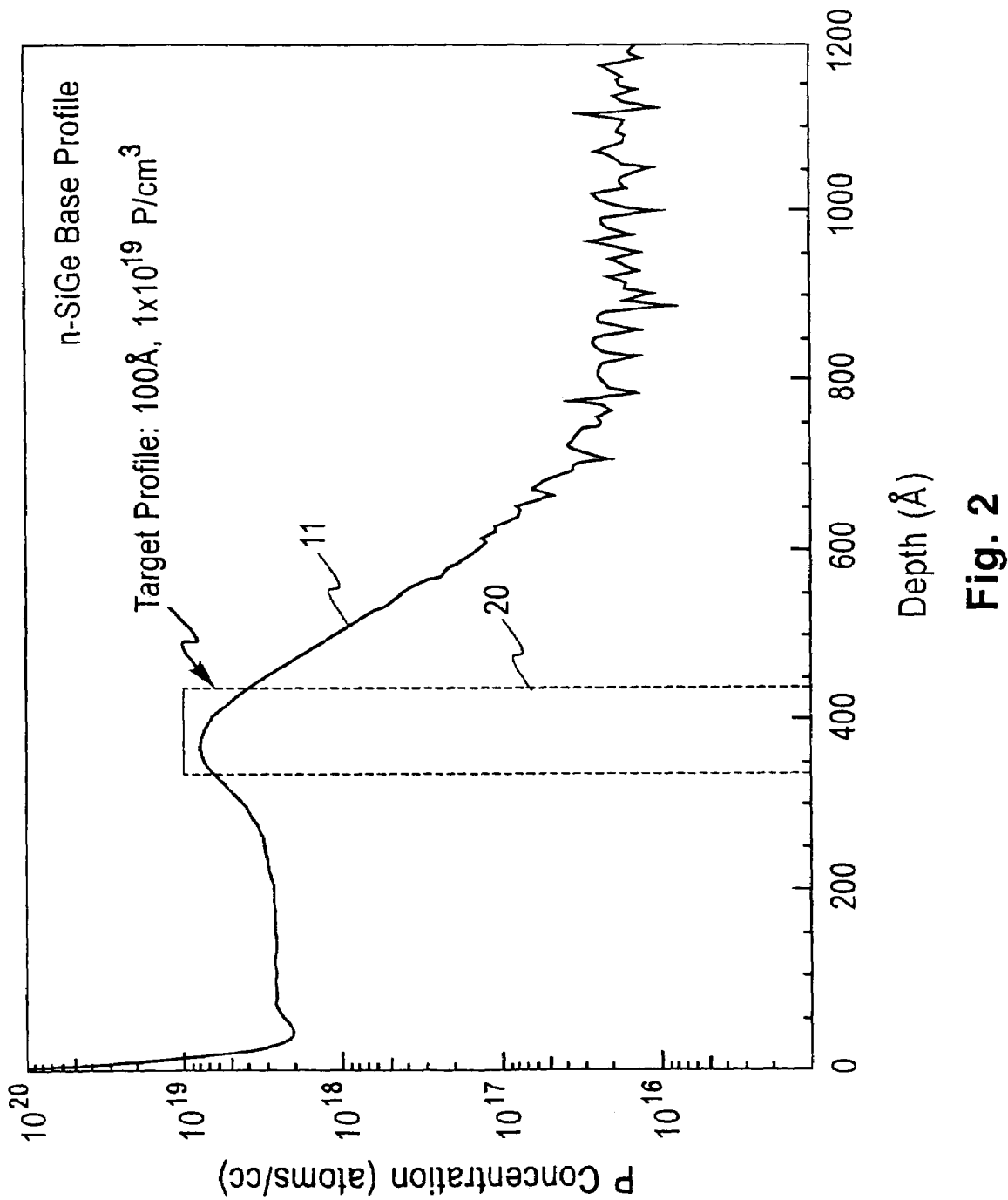
FIG. 2 is a graph of P concentration versus depth in a SiGe substrate showing an actual concentration profile to a desired profile.
Figure 3:
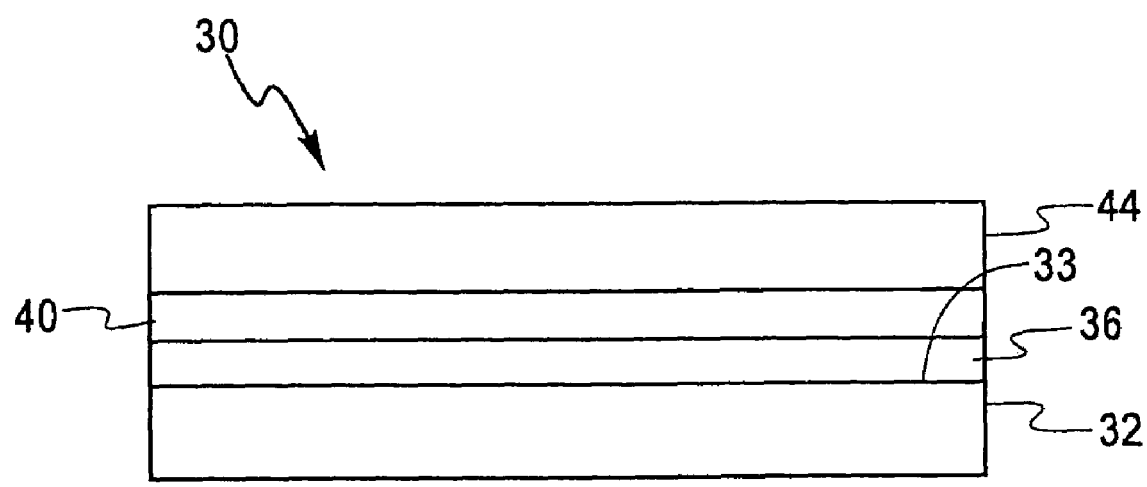
FIG. 3 is a cross section view of a first embodiment of the invention.

Referring to the drawing and in particular to FIG. 3, a cross section view of structure 30 having an abrupt phosphorus or arsenic profile or abrupt layer doping (ALD) is shown. A substrate 32 having an upper surface 33 may be for example single crystal Si or SiGe. A first layer 36 of 100% or substantially Ge is epitaxially formed on upper surface 33 having a thickness less than the critical thickness and may be, for example, 0.5 to 2 nm and is doped with P or As.

The effect of the thickness of first layer 36 is not to increase the doping concentration of P or As, but the effect is to increase the sheet dose, which is the doping concentration multiplied by the doped layer thickness. The doping concentration is controlled by the flow rate of the dopant source gas and by the growth rate of first layer 36, which in turn, is controlled by the flow rate of the Ge source gas which may be, for example, $GeH_4$.

The critical thickness of a layer is the thickness after which the layer relaxes to relieve strain due to lattice mismatch which for a Ge layer is about 1.04 the lattice spacing of a Si layer. Normally, the mechanism for relieving strain is the generation of crystal lattice defects e.g. misfit dislocations which may propagate to the surface in the form of threading dislocations. A relaxed layer is no longer lattice matched to the layer below.

First layer 36 is substantially Ge and may be 100% Ge. A second layer 40 comprising Si or SiGe doped to any desired level is formed over first layer 36. Second layer 40 may be formed in a UHV-CVD reactor with a dopant source gas such as $PH_3$. A Si source gas such as $SiH_4$ or $Si_2H_6$ and a Ge source gas such as $GeH_4$ may be used. A third layer 44 comprising doped or undoped Si or SiGe may be formed in a UHV-CVD reactor over second layer 40.

A UHV-CVD. reactor suitable for use in depositing first layer 36, second layer 40 and third layer 44 is available from Leybold-Heraeus Co., Germany and is described in U.S. Pat. No. 5,181,964 which issued Jan. 26, 1993 to B. S. Meyerson and in U.S. Pat. No. 5,607,511 which issued Mar. 4, 1997 to B. S. Meyerson which are incorporated herein by reference. The operation of the reactor and suitable methods for depositing Si and SiGe films is described in U.S. Pat. No. 5,298,452 which issued Mar. 29, 1994 to B. S. Meyerson and which is incorporated herein by reference.

Figure 4:
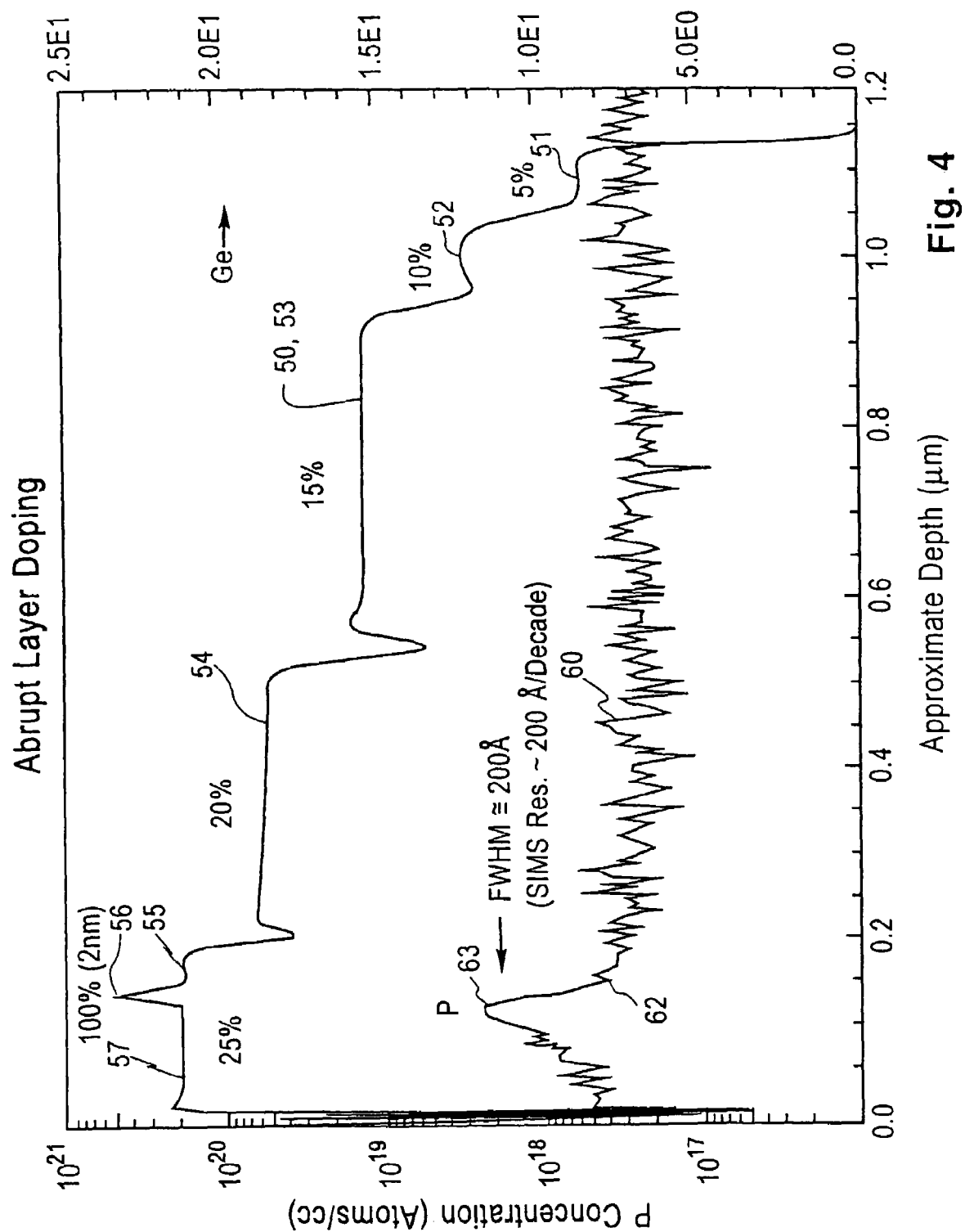
FIG. 4 is a graph of P dopant concentration versus depth and of Ge in $Si_{1-x}Ge_x$ versus depth illustrating the invention.

Referring to FIG. 4, secondary ion mass spectroscopy (SIMS) data was obtained from a multilayered structure of $Si_{1-x}Ge_x$ doped with phosphorus. In FIG. 4, the ordinate on the right side represents Ge relative intensity with respect to curve 50 and the abscissa represents approximate depth in microns below the surface of the multilayered structure. The structure at a depth of 1.17 μm is 100% Si with the amount of Ge, X equal to zero. AS shown by level curve portions 51–57 on curve 50, the amount X of Ge is 0.05 at from 1.12 to 1.08 μm, 0.10 at from 1.03 to 0.99 μm, at 0.15 from 0.93 to 0.59 μm, 0.20 from 0.52 to 0.24 μm, 0.25 from 0.2 to 0.17 μm, 1.0 from 0.17 to 0.13 μm, and 0.25 from 0.13 to 0.3 μm, respectively. The layers were epitaxially grown over a single crystal substrate by varying the flow rate of $GeH_4$. Curve 60 shows the in-situ phosphorus doping in the multilayers as a function of depth using $PH_3$ as the dopant source gas. In FIG. 4, the ordinate on the left side represents P concentration (atoms/cc) with respect to curve 60 and the abscissa represents depth. The 100% seed layer of 0.5–2 nm at the depth of 0.17 μm allows for a very abrupt, phoshorus doping profile to occur as shown by curve 60 and particularly at curve portion 62–63, in FIG. 4 and at the same time allows for high doping P concentrations to be achieve controllably as shown by curve 70 in FIG. 5.

Figure 5:
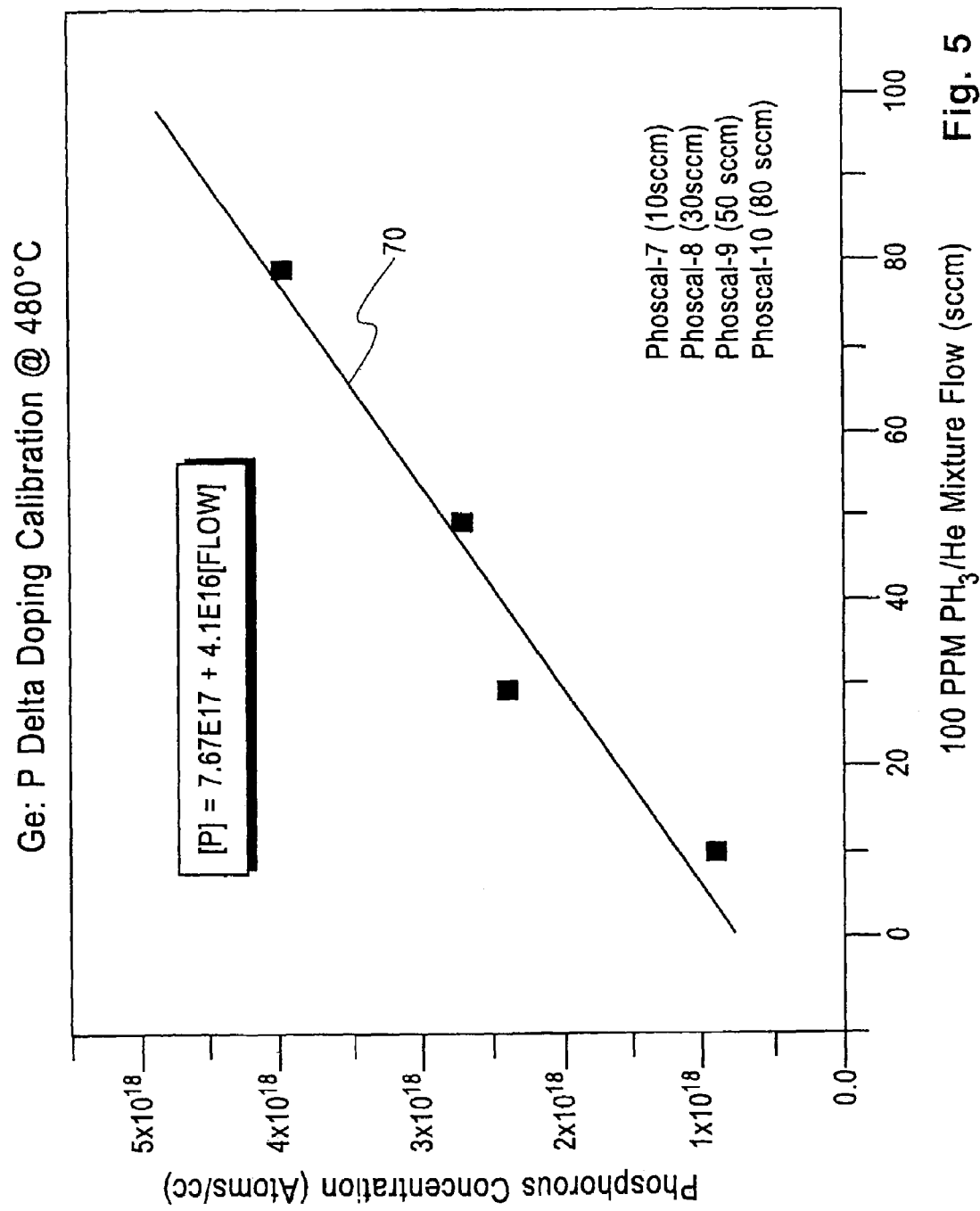
FIG. 5 is a graph of P concentration versus $PH_3$/He mixture flow rate in SCCM.

FIG. 5 is a graph of the phosphorus concentration (atoms/cc) versus 100 PPM $PH_3$/He mixture flow (SCCM). In FIG. 5, the ordinate represents phosphorus concentration (atoms/cc) and the abscissa represents flow (SCCM).

Due to the limitation of the SIMS technique to resolve very thin layers, the SIMS result shown in FIG. 4 gives a dopant profile width of about 150–200 Å at full width half maximum (FWHM). To better resolve the dopant profile, Hall measurements were used to measure and profile the active carriers throughout the doped sample by stepwise etching through the entire doped structure coupled with direct Hall measurement after each etching step.

Figure 6:
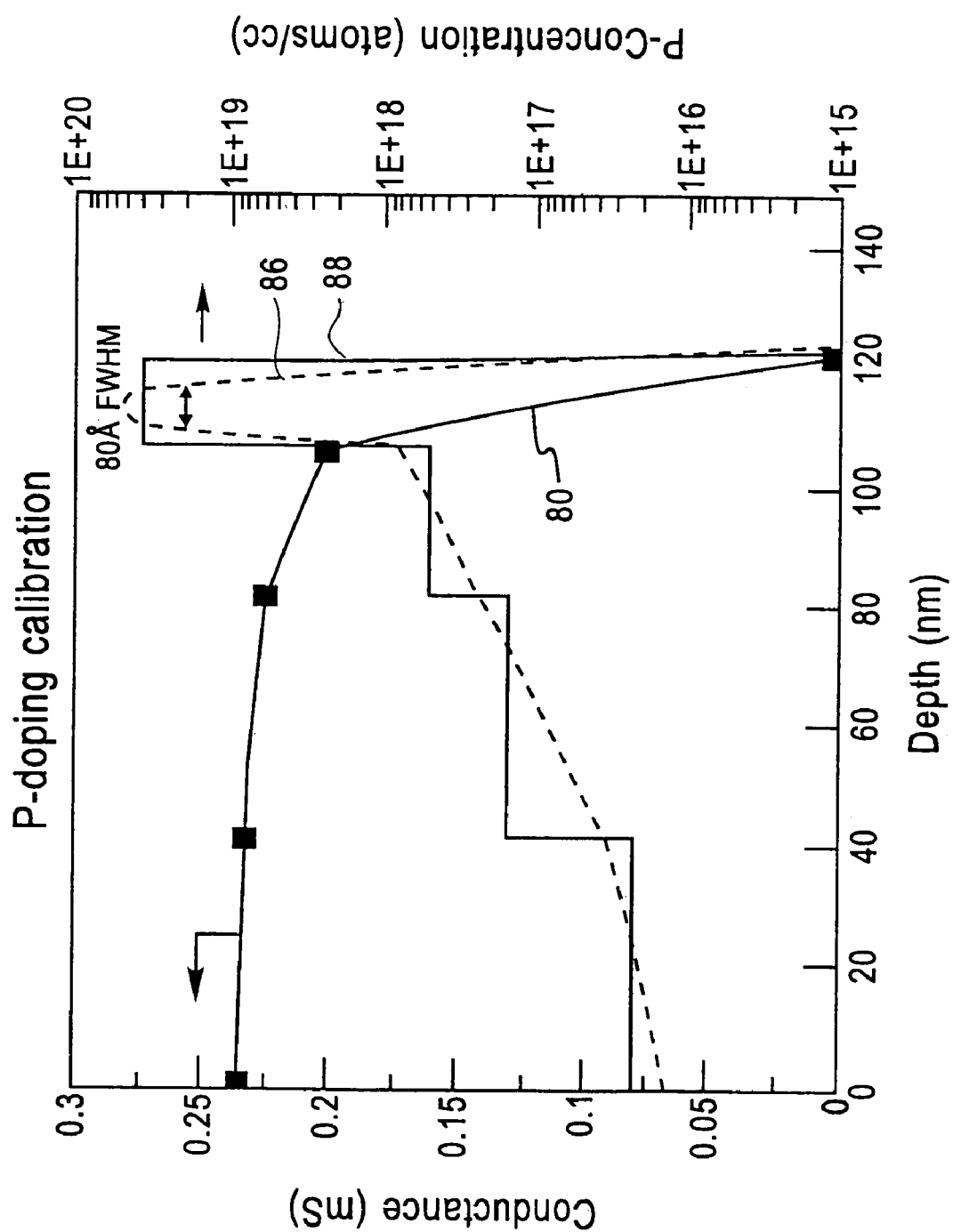
FIG. 6 is a graph of measured conductance versus depth as layers are removed and the projected P concentration versus depth in the layer.

FIG. 6 is a graph showing the conductance versus depth and showing the phosphorus concentration versus depth in a multilayered structure using direct Hall measurements. In FIG. 6 the ordinate on the left side represents conductance (mS) and the abscissa represents depth below the surface of a multilayered $Si_{1-x}Ge_x$ structure having a layer of 1–2 nm Ge at a depth of 115 nm. Curve 80 shows the conductance as measured versus depth. The conductance increases from 0 at 120 nm to 0.21 at 110 nm. The dopant profile as measured by the electrical measurement is shown by curve 88. Curve 80 and/or its data points were used to generate curve 88 shown in FIG. 6 which shows the actual phosphorus doping profile. Curve 88 was generated by dividing the carrier density as determined from the conductance shown by curve 80 at the respective etched depth by the etch layer thickness. In FIG. 6, the ordinate on the right side represents P concentration (atoms/cc). Curve 86 shows the projected concentration based on curve 88 which shows the peak concentration rising abruptly from less than $1 \times 10^{15}$ at 121 nm to $5 \times 10^{19}$ at 115 nm corresponding to a 13 Å per decade rise in P concentration. The FWHM based on curve 86 which itself is projected from curve 88 is 8 nm at a peak concentration of $2 \times 10^{19}$ atoms/cc. The doping concentration as shown by curve 86 decreases from $5 \times 10^{19}$ atoms/cc at 115 nm to about $8 \times 10^{17}$ atoms/cc at 109 nm and $1 \times 10^{17}$ atoms/cc at 64.9 nm. The decrease in P concentration from 115 nm to 64.9 nm corresponds to a 20 nm per decade fall or decrease in P concentration.

It is noted that $PH_3$ has a sticking coefficient S of 1.0 while $SiH_4$ has a sticking coefficient S of $1 \times 10^{-3}$ to $1 \times 10^{-4}$. The doping profile of P is a function of 1/GR where GR is the growth rate of the film.

Further, to eliminate background autodoping when an abrupt reduction in the P concentration is desired, a growth interrupt method is provided. The substrates or wafers are removed from the growth chamber or UHV-CVD to another vacuum chamber such as a load lock or transfer chamber or another UHV-CVD reactor or furnace where no $PH_3$ has been flown prior to loading. Then, $SiH_4$ and $GeH_4$ gases are flown in the growth chamber to coat the walls or heated surfaces of the growth chamber to bury or to isolate the P on the sidewalls. Then, the substrates or wafers are introduced or moved back into the main or growth chamber and the growth of Si or $Si_{1-x}Ge_x$ is continued. Alternatively, another UHV-CVD reactor or furnace coupled to the transfer chamber may be used to continue the growth of Si or SiGe with reduced or no P or As doping.

Figure 7:
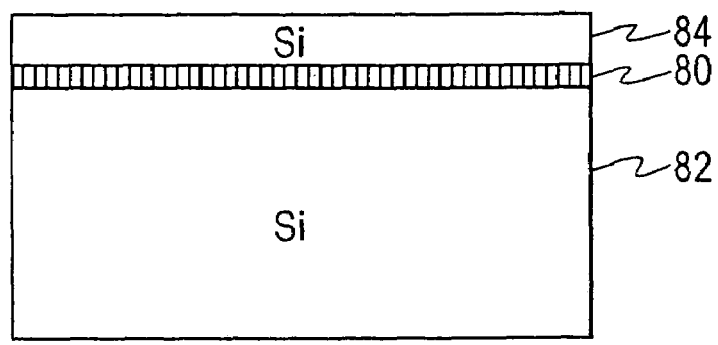
FIG. 7 is a cross section view of a layered structure.
Figure 8:
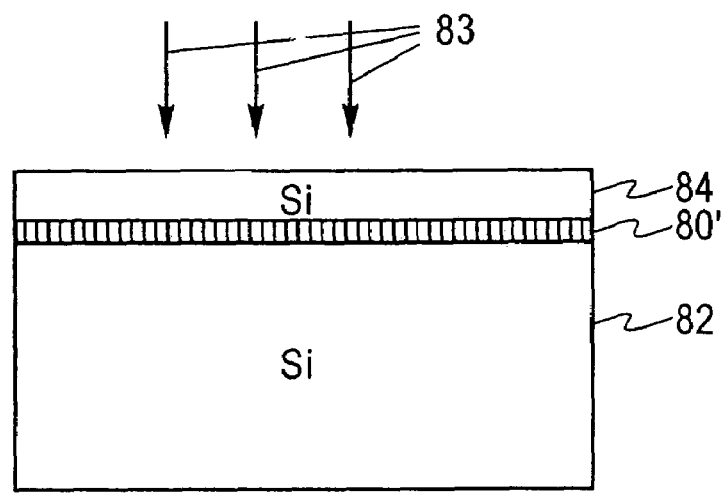
FIG. 8 is a cross section view of a layered structure having an amorphized layer.

Another method for achieving abrupt P doping, is to grow a first epitaxial layer 80 in the range from 1 to 10 nm thick of $Si_{1-x}Ge_x$ on a substrate 82 as shown in FIG. 7. The higher the value of X the better for converting layer 80 to amorphous material by ion implantation by ions 83 shown in FIG. 8; X may be, for example, greater than 0.5. First epitaxial layer 80 may be unstrained or a strained layer due to lattice mismatch with respect to substrate 82. A second epitaxial layer 84 may be grown over first epitaxial layer 80. Layer 84 may be Si or SiGe and may be unstrained or strained. Then using ion implantation shown in FIG. 8, the first epitaxial layer 80 may be selectively amorphized to form layer 80' shown in FIG. 8 by ions 83 with respect to layer 84 and substrate 82 at a dose in the range from about $10^{13}$ to about $10^{14}$ atoms/$cm^2$ or higher; layer 84 and any other Si or SiGe layers will not be amorphized. The Ge content of layer 84 and the other layers should be less than the content X in layer 80.

The critical dose for amorphization depends on the implanted species as well as on the host lattice. For example, boron does not amorphize Si at any dose, but amorphizes Ge at a dose higher than $1 \times 10^{14}$ atoms/$cm^2$. Asqenic amorphizes Si at a dose of about $5 \times 10^{14}$ atoms/$cm^2$, while Arsenic amorphizes Ge at a dose of $1 \times 10^{13}$ atoms/$cm^2$. Thus if an implant dose below the amorphization threshold in Si but above that in SiGe or Ge is used, then only the SiGe or Ge will be amorphized. The dossage peak should be adjusted to occur at the depth of the layer to be amorphized, layer 80.

Figure 9:
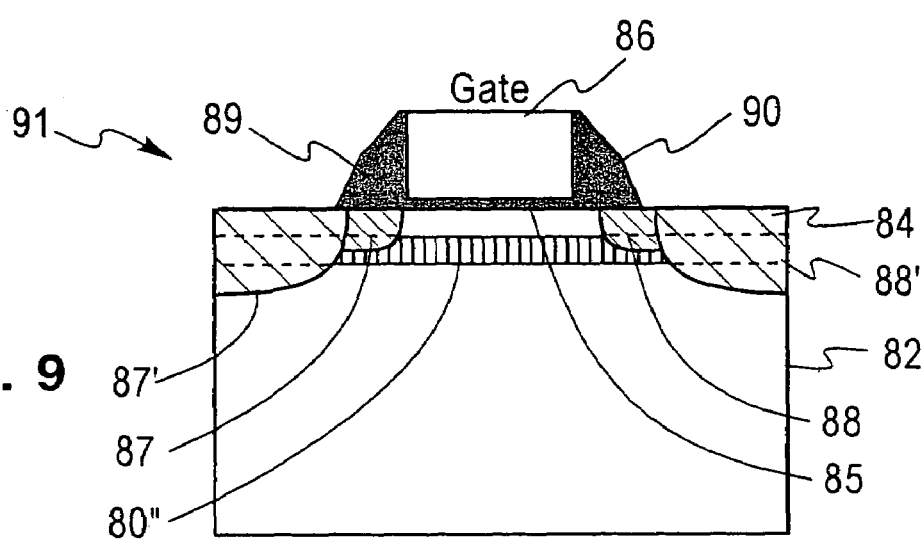
FIG. 9 is a cross section view of a second embodiment of the invention.

Substrate 82 and first epitaxial layer 80 is then heated to a temperature in the range from 400° C. to 500° for a period of time such as from 1 to 5 hours which results in solid phase recrystallization of the amorphized layer to form $Si_{1-x}Ge_x$ layer 80" shown in FIG. 9.

Recrystallization of amorphous layer 80' is dependent upon the material of the layer. Amorphous Ge recrystallizes at a temperature T greater than 350° C., while Si recrystallizes at a temperature T greater than 500° C. The combination of amorphization threshold dose and recrystallization temperature difference between Si and Ge is key to provide recrystallized layers.

The alloy SiGe recrystallization temperature will be somewhere in between Si and Ge, depending on the Ge content. If thicker doped layers are sought, which are above the critical thickness of Ge on Si, then SiGe with the highest possible Ge content (that will stay strained) should be used. To maximize the sharpness of the doping profile, the layers surrounding the doped layer should have the lowest possible Ge content (depending on the design)

Dopant activation occurs only in layer 80". Thus the doped layer thickness 80" is determined by the original epitaxial layer thickness 80. Diffusion of P dopants at the recrystallization temperature is negligible.

The above method applies to any species and not just to P. In fact getting sharp p-type implants is very much needed in the channel implant of 0.25 μm PMOS and will be needed more when the gate length is shrunk. B cannot be used for such super retrograde profiles, and hence people have resorted to heavy ions such as In. However, the degradation in channel mobility is higher in that case, and the incorporation of In at levels higher than $5 \times 10^{17}$ atoms/$cm^3$ is almost impossible.

An n or p channel field effect transistor 91 is shown in FIG. 9 utilizing layer 80". A dielectric layer 85 may be formed on the upper surface of layer 84 to form a gate dielectric such as silicon dioxide. A gate 86 may be blanket deposited and patterned above dielectric 85 which may be polysilicon. Self aligned shallow source and drain regions 87 and 88 may be formed in layer 84 by ion implantation using gate 86 as a mask. Sidewall spacers 89 and 90 may be formed on the sidewalls of gate 86. Source and drain regions 87' and 88' may be formed in layers 80 and 84 and substrate 82 using sidewall spacers 89 and 90 as a mask. Source 87 and 87' and drain 88 and 88' may be of one type material (n or p) and layer 80" may be of the opposite type material. Layer 80" functions to adjust the threshold voltage of the field effect transistor 91, prevent short channel effects and prevent punch through between source and drain.

Figure 10:
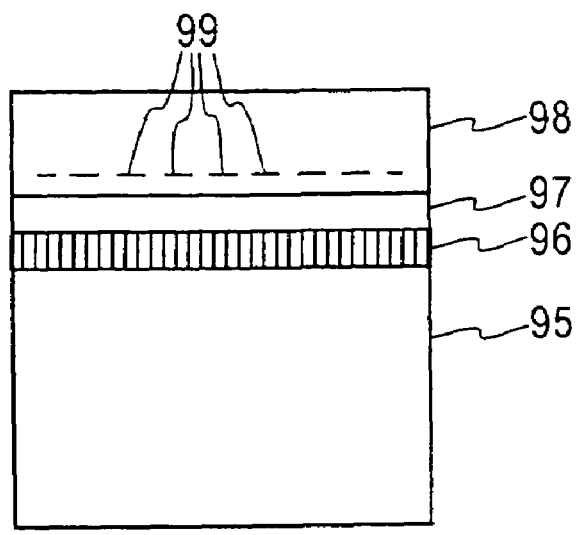
FIG. 10 is a cross section view showing an intermediate step in forming the embodiment of FIG. 11.

Referring to FIG. 10, an intermediate step in forming a field effect transistor is shown. A substrate 95 may be relaxed undoped SiGe. A phosphorous-doped Ge layer 96 is formed thereover as described with reference to FIGS. 3 of 9. An undoped SiGe layer 97 is formed over layer 96. A strained undoped Si layer 98 may be formed over layer 97. Layer 98 is suitable for an electron or hole gas 99 to be present under proper voltage biasing conditions.

Figure 11:
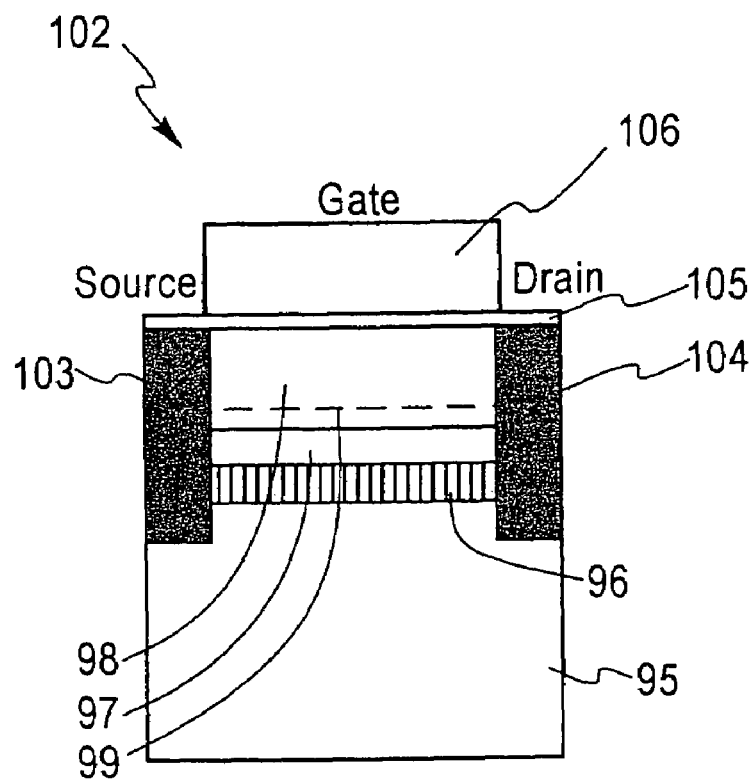
FIG. 11 is a cross section view showing a third embodiment of the invention.

Referring to FIG. 11, field effect transistor 102 is shown. In FIG. 11, like reference numbers are used for functions corresponding to the apparatus FIG. 10. Source and drain regions 103 and 104 are formed spaced apart through layers 96–98 and into substrate 95. A gate dielectric 105 may be formed over layer 98 in the region between source 103 and drain 104. A gate electrode 106 of polysilicon or metal may be blanket deposited and patterned. Alternately, gate dielectric 105 may be deleted and a gate electrode of metal may form a Schottky barrier with layer 98.

Figure 12:
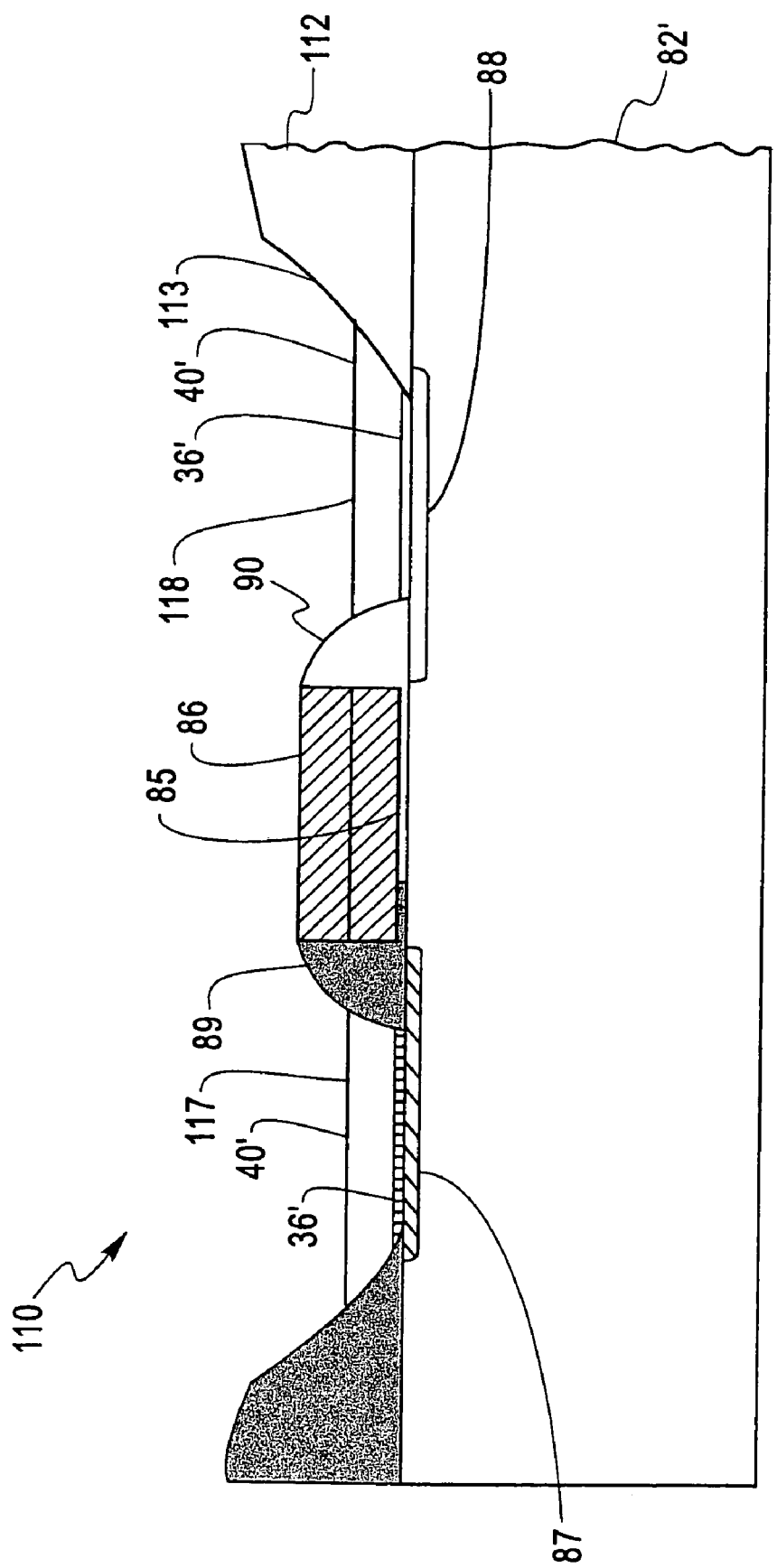
FIG. 12 is a cross section view showing a fourth embodiment of the invention.

Referring to FIG. 12, a cross section view of field effect transistor 110 is shown with raised source 40' and drain 40". In FIG. 12 like references are used for functions corresponding to the apparatus of FIGS. 3 and 9. Substrate 82' has a layer of field oxide 112 thereover with an opening 113 formed therein. In opening 113, a gate dielectric 85 is formed on substrate 82'. A gate electrode 86 is formed such as from polysilicon and a shallow source 87 and drain 88 are formed by, for example, ion implantation self aligned with respect to gate electrode 86. Next, sidewalls 89 and 90 are formed on either side of gate electrode 86. Next, a layer 36' is selectively formed epitaxially on shallow source 87 and drain 88 on substrate 82' which is phosphorous or arsenic doped. Layer 36' is Ge or substantially Ge and corresponds to layer 36 in FIG. 3. Above layer 36', layer 40' of Si or SiGe is selectively formed epitaxially which is phosphorous or arsenic doped during fabrication. Layer 40' forms source 117 above shallow source 87 and forms drain 118 above shallow drain 88. Metal silicide contacts (not shown) may be made to source 117 and drain 118.

While there has been described and illustrated a structure having an abrupt doping profile and methods for forming an abrupt profile, it will be apparent to those skilled in the art that modifications and variations are possible without deviating from the broad scope of the invention which shall be limited solely by the scope of the claims appended hereto.

Having thus described our invention, what we claim as new and desire to secure by Letters Patent is:

1. A structure having an abrupt doping profile comprising:
   a single crystal semiconductor substrate having an upper surface,
   a first epitaxial layer of Ge over said upper surface,
   said first epitaxial layer having a thickness in the range from about 0.5 nm to about 2 nm, said first epitaxial layer having a concentration of dopant greater than $5 \times 10^{19}$ atoms/cc, said dopant selected from the group consisting of phosphorus and arsenic, and
   a second epitaxial layer of a semiconductor material over said first epitaxial layer.

2. The structure of claim 1 wherein said second layer comprises a material selected from the group consisting of Si and SiGe.

3. The structure of claim 1 wherein said second layer has a concentration change of said dopant from said first layer into 40 Å of said second layer of greater than $1 \times 10^{19}$ atoms/cc.

4. The structure of claim 1 further including a third epitaxial layer of semiconductor material having a doping profile with a dopant concentration less than $5 \times 10^{18}$ atoms/cc.

5. The structure of claim 1 wherein said second epitaxial layer having a thickness of at least 300 Å and having a doping of phosphorus less than $5 \times 10^{16}$ atoms/cc for a predetermined thickness after its initial 300 Å thickness.

6. A field effect transistor comprising:
   a single crystal substrate having a source region and a drain region with a channel therebetween and a gate electrode above said channel to control charge in said channel, and
   a first layer of Ge from about 0.5 nm to about 2 nm in thickness and doped with a dopant selected from the group consisting of phosphorus and arsenic at a dopant concentration of greater than $5 \times 10^{19}$ atoms/cc, wherein said first layer of Ge is positioned below said channel and extends through said source and drain regions.

7. The field effect transistor of claim 6 wherein said channel is in a second epitaxial layer selected from the group consisting of Si and SiGe formed over said first layer.

8. A field effect transistor comprising:
   a single crystal substrate,
   a first layer of Ge from about 0.5 nm to about 2 nm in thickness and doped with a dopant selected from the group consisting of phosphorus and arsenic at a dopant concentration of greater than $5 \times 10^{19}$ atoms/cc, wherein said first layer of Ge is formed on said substrate,
   a second layer of undoped SiGe epitaxially formed on said first layer,
   a third layer of strained undoped semiconductor material selected from the group consisting of Si and SiGe,
   a source region and a drain region with a channel therebetween, and
   a gate electrode above said channel to control charge in said channel.

9. A field effect transistor comprising
   a single crystal substrate,
   an oxide layer formed on said substrate having an opening,
   a gate dielectric and gate electrode formed in said opening over said substrate,
   a source and drain region formed in said substrate aligned with respect to said gate electrode,
   a dielectric sidewall spacer formed on either side of said gate electrode and above a portion of said source and drain regions,
   a first layer of Ge from about 0.5 nm to about 2 nm in thickness and doped with a dopant selected from the group consisting of phosphorus and arsenic selectively positioned over exposed portions of said source and drain regions,
   a second layer of semiconductor material selected from the group consisting of Si and SiGe doped with a dopant selected from the group consisting of phosphorus and arsenic epitaxially formed over said first layer to form raised source and drain regions.

* * * * *